United States Patent
Li et al.

(10) Patent No.: US 11,223,527 B1
(45) Date of Patent: Jan. 11, 2022

(54) CONFIGURING DATA CENTER NETWORK WIRING

(71) Applicant: Google LLC, Mountain View, CA (US)

(72) Inventors: Weiqiang Li, Milpitas, CA (US); Rui Wang, Sunnyvale, CA (US); Jianan Zhang, Sunnyvale, CA (US)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/119,614

(22) Filed: Dec. 11, 2020

Related U.S. Application Data

(60) Provisional application No. 63/051,098, filed on Jul. 13, 2020.

(51) Int. Cl.
*H04L 12/24* (2006.01)
*H05K 7/14* (2006.01)

(52) U.S. Cl.
CPC .......... *H04L 41/082* (2013.01); *H04L 41/065* (2013.01); *H04L 41/0896* (2013.01); *H04L 41/12* (2013.01); *H05K 7/1498* (2013.01)

(58) Field of Classification Search
CPC ..... H04L 41/082; H04L 41/065; H04L 41/12; H04L 41/0896; H05K 7/1498
See application file for complete search history.

(56) References Cited

U.S. PATENT DOCUMENTS

| | | | |
|---|---|---|---|
| 9,319,264 B1 * | 4/2016 | Poutievski | H04L 29/08315 |
| 2003/0099014 A1 * | 5/2003 | Egner | H04J 14/0241 |
| | | | 398/79 |
| 2006/0215564 A1 | 9/2006 | Breitgand et al. | |
| 2008/0049627 A1 * | 2/2008 | Nordin | H04L 41/12 |
| | | | 370/241 |
| 2017/0289015 A1 * | 10/2017 | Lim | H04Q 3/665 |
| 2017/0331717 A1 * | 11/2017 | Perrett | H04L 41/12 |
| 2018/0359544 A1 * | 12/2018 | Sagie | H04Q 11/0071 |
| 2019/0158939 A1 * | 5/2019 | Frankel | H04B 10/25 |
| 2020/0041725 A1 * | 2/2020 | Kewitsch | G02B 6/28 |
| 2020/0167442 A1 * | 5/2020 | Roecker | G06F 30/15 |

(Continued)

OTHER PUBLICATIONS

Shizhen Zhao, Rui Wang, Junlan Zhou, Joon Ong, Jeffrey C. Mogul, and Amin Vahdat, Minimal Rewiring: Efficient Live Expansion for Clos Data Center Networks, Proceedings of the 16th USENIX Symposium on Networked Systems Design and Implementation (NSDI '19), Feb. 26-28, 2019, pp. 221-234, USENIX Association, Boston, MA, USA.

(Continued)

*Primary Examiner* — Jonathan A Bui
(74) *Attorney, Agent, or Firm* — Lerner, David, Littenberg, Krumholz & Mentlik, LLP

(57) ABSTRACT

A datacenter network can be made of points of deliveries and patch panels. Rewiring the logical links within the datacenter network to meet a new network topology is computationally intense. Methods, systems, and apparatuses are provided to modify an existing network topology with a provided existing physical topology and logical topology into the new network topology. For example, the provided physical topology can include changes to the network, such as adding new points of delivery, adding additional patch panels, increasing the number of physical connections between points of delivery and patch panels, or removing a point of delivery.

20 Claims, 12 Drawing Sheets

(56) References Cited

U.S. PATENT DOCUMENTS

2020/0359117 A1* 11/2020 Kewitsch ............... H04B 10/27
2021/0101233 A1* 4/2021 Kewitsch ............. G02B 6/4452

OTHER PUBLICATIONS

Mingyang Zhang, Radhika Niranjan Mysore, Sucha Supittayapornpong, and Ramesh Govindan, Understanding Lifecycle Management Complexity of Datacenter Topologies, Proceedings of the 16th USENIX Symposium on Networked Systems Design and Implementation (NSDI '19), Feb. 26-28, 2019, pp. 235-254, USENIX Association, Boston, MA, USA.

Andrew R. Curtis, Tommy Carpenter, Mustafa Elsheikh, Alejandro Lopez-Ortiz and S. Keshav, Rewire: An Optimization-based Framework for Data Center Network Design, University of Waterloo Tech Report CS-2011-21, pp. 1-12, Cheriton School of Computer Science, University of Waterloo, Waterloo, ON, Canada.

Jayaram Mudigonda, Praveen Yalagandula, and Jeffrey C. Mogul, Taming the Flying Cable Monster: A Topology Design and Optimization Framework for Data-Center Networks, 2011 USENIX Annual Technical Conference (USENIX ATC '11), Jun. 15-17, 2011, 14 pages, USENIX Association, Portland, OR, USA.

"Core and Pod Data Center Design" [online]. [Retrieved Oct. 19, 2020]. Retrieved from the internet: <https://go.bigswitch.com/sites/default/files/gobigswitch/serve/Core-and-Pod+Overview.pdf>, 5 pages.

Deke Guo, Tao Chen, Dan Li, Mo Li, Yunhao Liu, and Guihai Chen, "Expandable and Cost-Effective Network Structures for Data Centers Using Dual-Port Servers," in IEEE Transactions on Computers, vol. 62, No. 7, pp. 1303-1317, Jul. 2013, doi: 10.1109/TC.2012.90. [Abstract Only].

Ye Yu and Chen Qian, "Space Shuffle: A Scalable, Flexible, and High-Performance Data Center Network," in IEEE Transactions on Parallel and Distributed Systems, vol. 27, No. 11, pp. 3351-3365, Nov. 1, 2016, doi: 10.1109/TPDS.2016.2533618. [Abstract Only].

Partial European Search Report for European Patent Application No. 21156860.5 dated Jul. 28, 2021. 14 pages.

Extended European Search Report for European Patent Application No. 21156860.5 dated Oct. 28, 2021. 13 pages.

* cited by examiner

CONFIGURING DATA CENTER NETWORK WIRING

CROSS-REFERENCE TO RELATED APPLICATIONS

The present application claims the benefit of the filing date of U.S. Provisional Patent Application No. 63/051,098 filed Jul. 13, 2020, the disclosure of which is hereby incorporated herein by reference.

BACKGROUND

A data center network can be made of points of delivery (Pods or PODs). A POD is a module of network, computational, storage, and other application components which work together to deliver network related services. PODs can be repeated in design to allow for the PODs within a network to be scalable, modular, and more manageable. When interconnected, PODs can form a data center network.

PODs are interconnected by patch panels. A patch panel is also known as a path bay, patch field, or jack field. A patch panel is a piece of hardware that contains a set number of ports to connect and manage the incoming and outgoing wires. A wire or wires between a first POD to a patch panel, and from that patch panel to a second POD allow for interconnection of the first POD and the second POD. The interconnections between the PODs form a physical topology. The physical topology refers to the physical links connecting PODs with patch panels. A logical topology is a set of logical links which connect a port in the patch panel to another port in the same patch panel. A logical topology over all patch panels can be thought of as a functional "system level" view of the data center as a whole.

SUMMARY

Aspects of the present disclosure include methods, systems, and apparatuses for scalable expansions and modifications to data centers through rewiring of PODs.

Aspects of the present disclosure provide determining a first network topology. The first network topology can comprise a first set of physical connections, each physical connection created between a port on a point of delivery (POD) and a port on a patch panel; a first set of logical connections within each patch panel of the network. A set of capacity intents can be received, each capacity intent within the set of capacity intents corresponding to each pair of PODs within the network. One or more computing devices can determine a set of reconfigurations to logical links within each patch panel of the network to generate a second network topology. The second network topology comprises a logical topology for each patch panel in the network. In the second network, the summation over all pod-level multigraphs for the second network topology can be equal to the received set of capacity intents.

Additional aspects of the present disclosure provide the network topology is represented as a multigraph. The set of reconfigurations of logical links can minimize the number of reconfigurations within the set of reconfigurations to the logical links. The set of reconfigurations can also approximate a "global" minimum solution to the set of reconfigurations to the logical links. The set of reconfigurations can not alter the existing physical connections of the network. Instructions related to the set of reconfigurations can be generated. The set of instructions related to the set of reconfigurations can be sent to a user device. The set of instructions related to the set of reconfigurations can be stored as human-readable instructions. An indication that a reconfiguration from the set of reconfigurations of a logical link has successfully been reconfigured can be received at a user device. The computing device can recursively 2-partition the second network topology as part of determining a set of reconfigurations of logical links. The second network topology can satisfy a failure domain constraint for the network. In some examples, the algorithm can closely approximate, such as within an error of 10 percent, of the "global" maximum overlap with an existing set of connections or a "global" minimum number of changes to the existing set of connections. A global maximum or global minimum can be based on, for example, a brute-force or other computational method.

Additional aspects of the present disclosure provide a non-transient computer readable medium containing program instructions, the instructions when executed perform the steps of determining a first network topology, the first network topology comprising a first set of physical connections, each physical connection created between a port on a point of delivery (POD) and a port on a patch panel; a first set of logical connections within each patch panel of the network; receiving a set of capacity intents, each capacity intent within the set of capacity intents corresponding to each pair of PODs within the network; and determining with one or more computing devices a set of reconfigurations to logical links within each patch panel of the network to generate a second network topology; wherein the second network topology comprises a logical topology for each patch panel pod in the network, and in which the summation over all pod-level multigraphs for the second network topology is equal to the received set of capacity intents.

Additional aspects of the present disclosure provide program instructions when executed generating instructions related to the set of reconfigurations. The program instructions when executed can generate instructions related to the set of reconfigurations. The program instructions when executed can send the set of instructions related to the set of reconfigurations to a user device. The set of instructions related to the set of reconfigurations can be grouped by failure domain.

Additional aspects of the present disclosure provide a network, the network comprising a set of points of delivery (POD), each POD having m ports; a set of patch panels, each patch panel having n ports; a set of physical connections, each physical connection formed between a port of a POD and a port of a patch panel; a current set of logical links within each patch panel, wherein the logical link is algorithmically derived, wherein the algorithm takes as inputs (i) the set of physical connections, (ii) a desired logical topology or a capacity intent for the network, and (iii) a prior set of logical links and outputs the current set of logical links within each panel such that the overlap between the prior set of logical links and the current set of logical links is greatest. All ports of the network can be used. The network can be a mesh network. Each POD can be connected with each patch panel, and each patch panel can be connected with each POD of the network. The output can be implemented in stages, and each stage can correspond to a failure domain of the network or algorithm. The global solution can be a mathematically derived solution which minimizes the number of logical link changes which need to occur to achieve the target or desired logical topology, which can be calculated for example by checking every solution for the logical topology.

BRIEF DESCRIPTION OF THE DRAWINGS

The accompanying drawings are not intended to be drawn to scale. Like reference numbers and designations in the various drawings indicate like elements. For purposes of clarity, not every component may be labeled in every drawing. In the drawings.

DETAILED DESCRIPTION

Overview

Figure 1:
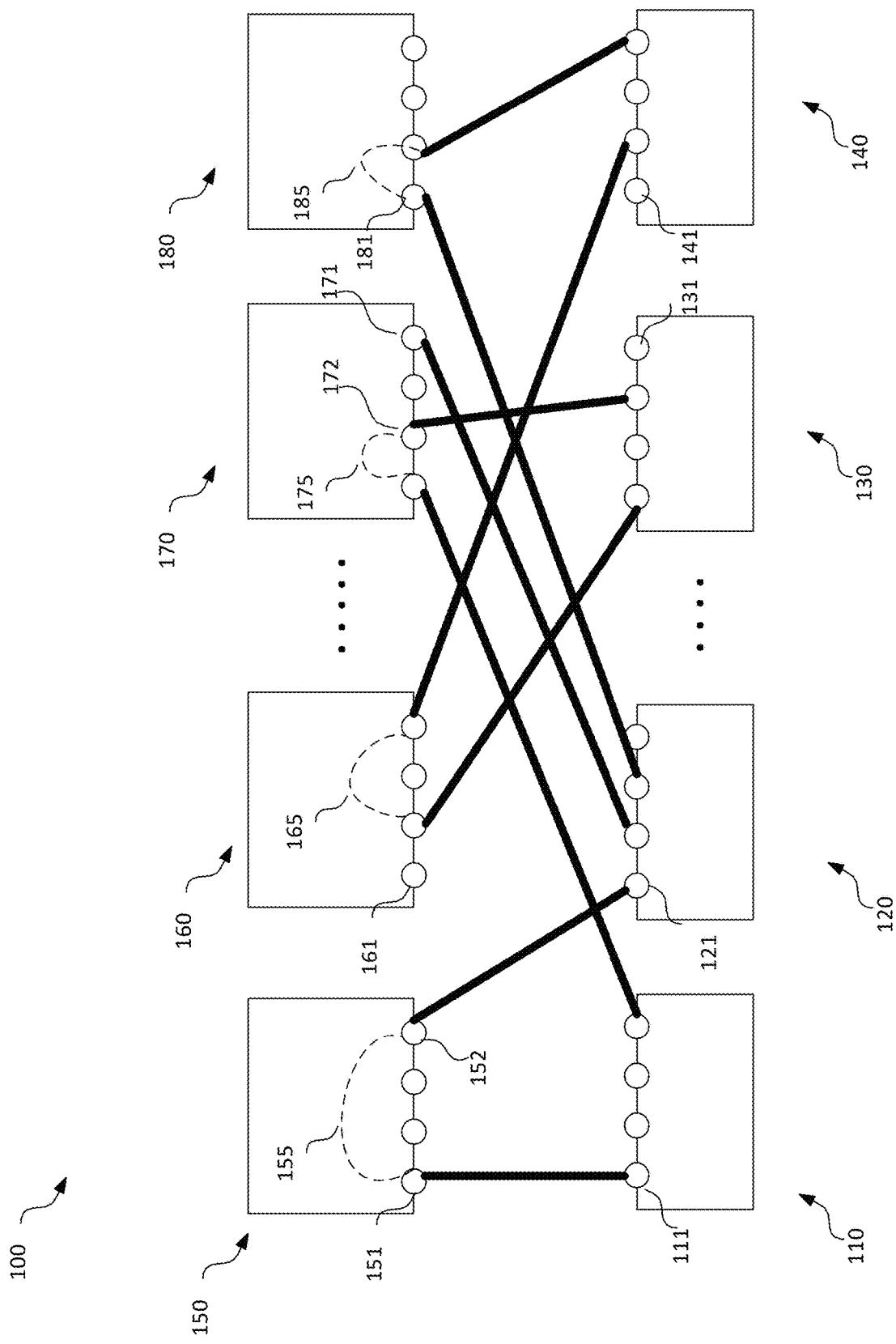
FIG. 1 illustrates a schematic view of a datacenter.

A failure of a patch panel or link within the physical topology of a data center impacts interconnections between PODs and may impact the flow of data between affected PODs and within the data center. In addition, implementing a new physical or logical topology may be desirable for a given data center. A new physical topology may be created for example because of changing physical equipment within a network, such as for example patch panels or addition of new PODs, or availability of new space. A new logical technology would be required to enable the operation of the network with the updated physical topology. A new logical topology may also be desired to allow data to be prioritized between certain PODs or to increase the bandwidth or capacity of certain PODs and the data center, which may be the result of for example data center expansion.

Upon making a change to a data center, such as in the number of patch panels, PODs, interconnections, or physical topology, a corresponding change must be made in the logical topology of the network. Existing methods to change the logical topology cannot successfully be applied to every type of data center, including for example, a mesh based datacenter network. Additionally, existing methods require that the data center become inoperable during the reconfiguration or expansion of the data center. Even further, the number of days required for a datacenter expansion generally corresponds to the number of stages of the expansion. Thus, these methods cannot practically enable scalable expansions for data centers and often algorithms which are computationally infeasible. There is thus a need for robust, scalable, and universally applicable technologies to reconfigure logical topologies for networks of all types, including mesh networks, while simultaneously allowing the network to carry live data during the reconfiguration of the logical topology, which can be carried out in multiple stages. Aspects of the disclosed technology allow for an "approximate" solution which is near a global maximum or minimum solution without brute-force computations, and can be executed to enable live upgrades or changes to a network topology.

Some example cases in which a new logical topology will be required include the following. In some examples, a POD can be added to the network, and physical connections between the new or existing PODs and the patch panels can change. In addition to the physical links changing, a change in the logical topology is needed. In another example, upon upgrading the radix of a POD or the number of physical links between a POD and each Patch panel, the physical topology of the network can change. This change will require a corresponding change in the physical topology of the network. In other examples, one or more PODs can be removed from a datacenter network. In this example a logical topology can be determined for a network as if that POD was already moved. After configuring the patch panels with the new logical topology, the network can be operational while the POD intended to be removed is physically removed from the network. In yet other examples, additional patch panels can be added in a patch expansion. As explained further below, logical links within a patch panel can be removed for a specific failure domain, the number of patch panels within that domain expanded, the new logical topology set in the logical links of all patch panels within that failure domain, and the new logical topology used for that specific failure domain.

In yet other examples, it may be desired to change the number of logical links between any two PODs depending on the specific traffic between those two PODs. In some examples, the technology may update the existing topology to a new topology that better supports traffic demands, by reconfiguring the number of links between pods and allowing one pod pair to have more links than another pod pair if the first pair has large traffic.

As used herein, generally, a physical link refers to the link between a patch panel and a POD. A logical link refers to the link within a patch panel between one port of the patch panel to another port of the same patch panel.

As a new logical topology requires a corresponding change of underlying or internal port-to-port connections within a patch panel, it is desirable to have instructions on how to rewire or configure these links within patch panels, to achieve the new logical topology. Existing methods further do not minimize the changes to be made in existing port connections inside the patch panel. In addition, these methods cannot successfully be applied to every data center. Additionally, existing methods require that the data center become inoperable or suffer from degraded performance during the reconfiguration or expansion of the data center. Even further, the number of days required for a datacenter expansion generally corresponds to the number of stages of the expansion. Thus, these methods cannot practically enable scalable expansions for data centers.

Aspects of the disclosed technology relate to enabling scalable expansions in data centers through efficient rewiring of the interconnections between PODs within a data center. The disclosure provides a method of physical rewiring of patch panels or between patch panels of a network based upon a given base logical topology for the network, a new or desired logical topology for the network, and the existing physical topology of the network. The method of rewiring or restriping of the links between PODs through a patch panel can be applied for any arbitrary desired logical topology given any existing base logical topology and existing physical topology. Further, the method can be applied to a desired logical topology of any arbitrary size and in general, the computational complexity of the method is linear with the size of the desired logical topology.

In other examples, the technology may assist in adding new PODs to a datacenter network. The new minimal-restriping techniques of the technology partition the original problem into many small or base integer linear programming problems. Each integer linear programming problem can be solved almost instantaneously, and generally in less than 1 second. Accordingly, the technology enables solving expansion problems to be solved in polynomial time. As explained further below, minimal-restripe allows a lower number of logical link changes or reconfigurations to be made in the patch panels. Logical link changes in the patch panels are also known as port connections changes. Changing internal logic links or port connections in the patch panels is performed manually and is time-consuming. As rewiring port connections in patch panels can consist of two steps, removing the old logical links and then adding the new logical links, the common links can still allow for transmission of data during the rewiring process. From the perspective of network performance, the more common links between the set of old logical links and the set of new logical links, the less datacenter network capacity degradation will occur during the rewiring. The smaller the amount of degradation, the smaller the amount of traffic loss will occur in the network.

For example, the technology may accept as inputs one or more logical links that are desired to be implemented in a data center and provide as an output a rewiring plan for interconnecting one or more PODs that would be used in implementing the rewiring plan. Depending on the number and type of logical links desired, the rewiring plan may include adding new wiring interconnecting certain PODs while removing existing wiring. Alternatively, the rewiring plan may comprise establishing new logical links that result in an overall reduction of the wiring interconnecting PODs.

In other examples, the technology may accept as inputs the one or more physical links between PODs and patch panels, existing logical links within one or more patch panels, one or more logical links that are desired to be implemented on the network, or an overall new logical topology for a network. The technology may provide as output, based on one or more of the proceeding inputs, a set of logical links which can be reconfigured within patch panels to create the new logical topology of the network.

In some examples, the technology may accept as inputs one or more existing parameters related to a network as well as desired or new parameters of the network. The technology may translate or interpret the parameters as a mathematical graph. The technology may sequentially divide the graph into subgraphs by 2-partitioning an integer number of times. In some examples, the number of graphs generated by 2-partitioning can be equal to the number of failure domains of the network. In some examples, the 2-partitioning can be performed using an integer linear programming problem. In some examples, the number of failure domains is equal to the number of patch panels. The technology can match or map each subgraph to a failure domain or patch panel level logical topology. The technology can solve equations related to the match to establish a new logical topology.

In some examples, the technology can accept a capacity intent, and a base logical topology as inputs. The capacity intent and base logical topology, which are provided as inputs above, can be partitioned. The inter-pod capacity intent can be divided into a number of intents equal to the number of patch panels. In capacity intent can be divided into $2^n$ pod-level intents, where $2^n$ is also the number of patch panels. The $2^n$ pod-level intents obtained can be mapped to the $2^n$ base logical topologies of the patch panels can be used as inputs, and both the intents and the base logical topologies can be mapped into corresponding patch panels. $2^n$ "base" mapping problems can be solved. Each mapping problem can identify or solve for overlapping logical links between the base logical topology and the capacity intent. A graph difference between the capacity intent and the base logical topologies can be obtained for each patch panel. The graph difference can identify the new logical links needed to create the new logical topology corresponding to the capacity intent. The solution can be a rewiring or rematching of a logical link within each patch panel. The obtained solutions aggregated to establish all links required to create a new logical topology corresponding to the capacity intent provided as an input. The technology can ensure that the obtained solution is compatible with the physical topology of the network. The capacity intent can also be thought of as a high-level target logical topology for the network.

Aspects of the disclosed technology relate to enabling finding solutions for finding a new logical topology on the order of seconds, with an upper bound of 30 seconds. Aspects of the technology ensure a success rate of 100%. In addition, for a minimal restripe, which is outputting an output logical topology which maximizes the intersection with a base logical topology, also has a 100% success rate. The technology disclosed works for all use cases in a rapid manner, to enable real-time robust expansions and changes to datacenter networks. The technology disclosed herein finds the logical topology and may minimize the changes made in the internal patch panel links and can further the computational complexity of finding the new logical topology so as to allow for real-time changes to data-center networks. The technology disclosed herein can be applicable to mesh networks and certain clos networks.

Example Systems

FIG. 1 illustrates a schematic view of an example of a datacenter 100. FIG. 1 illustrates PODs 110, 120, 130, and 140 and patch panels 150, 160, 170, and 180. A datacenter can house multiple computing systems, including for example computing devices, processors, servers, etc., used to control access to or store data, as well as perform other computing functions. In some examples, a datacenter can divide the computing devices in equal numbers within enclosures of server racks. In some examples, datacenter 100 can be a spine-free datacenter. As used herein, "network" or "datacenter" refer to a datacenter network, such as datacenter 100. A network can also be a subset of the entire network or datacenter. For example, a network can be any subset consisting of two or more PODs.

A POD is a module of network, computational, storage, and other application components which work together to deliver network related services. PODs can be repeated in design to allow for the PODs within a network to be scalable, modular, and more manageable. When interconnected, PODs can form a datacenter network, such as datacenter 100. For example, each POD can have servers and/or computing devices with volatile memory, non-volatile memory, processors, ASICs; routers; storage; power; and other hardware configured with network protocols to enable transfer, storage, or retrieval of information.

A patch panel is a hardware device which contains a fixed number of ports to connect and manage incoming and outgoing cables, such as copper cables or fiber cables which carry data. In general, the cables and other physical means used with a patch panel is generally considered to be wiring. As illustrated in dotted lines 155, 165, 175, and 185 in FIG. 1, a patch panel can have an internal connection which connects two ports of the patch panel. These internal connections can be considered to be logical links. Through this connection, a patch panel can bridge or interconnect two PODs via its ports. In some examples, changing the wiring between ports of a patch panel can cause a corresponding change in the logical topology of the network.

Although only four PODs are illustrated for simplicity, it is understood that any number of PODs can be included in datacenter 100. Each POD can have a number of ports. For example, each POD can have 'd' ports, where d is a positive integer. In some examples, d can be 256, 512, or 1024 ports. In some examples, each POD will have the same number of ports but PODs within a datacenter may have different numbers of ports. PODs 110, 120, 130, and 140 for example have respectively, ports 111, 121, 131, and 141 labelled. Illustrated in FIG. 1 are four ports in each POD, some of which are unlabeled for clarity. In some examples, the number of ports in a POD must be an integer multiple of the number of patch panels. Patch panels 150, 160, 170, and 180 are also shown with only four ports for the sake of clarity. In some examples, network 100 can have $2^n$ patch panels. In other examples, the number of patch panels can be determined by the number of PODs. In yet other examples, the number of patch panels can be divisible by d or by 256. In some examples, each patch panel can be connected to each POD, and each POD can be connected to each patch panel. In some examples, the technology can work for any value d, where $d=k*(2^n)$. In other examples, as long as d is a multiple of the number of patch panels, the technology of disclosed will be functional. In some examples, $2^n$ must divide the number of ports in every POD. A person skilled in the art should understand that the specific implementation and integer values for the system can be modified.

Illustrated in FIG. 1 with unlabeled solid lines between the PODs and patch panels are physical connections. In some examples, these connections can be fiber optic wires or copper wire connections. These wires can connect ports on a POD to ports on a patch panel. In turn, the patch panel can connect to other PODs to form a network. For example, POD 110 and POD 120 are connected through patch panel 150 via port 111 connecting with port 151, and port 152 connecting with port 121. Port 151 and 152 are connected internally within patch panel 150 through link 155. Although additional connections can exist between the PODs and patch panels, for simplicity, only a few physical connections are illustrated. In some examples, all PODs can be connected to all patch panels. In some examples, each patch panel can be connected to each POD, and each POD can be connected to each patch panel.

Figure 2A:
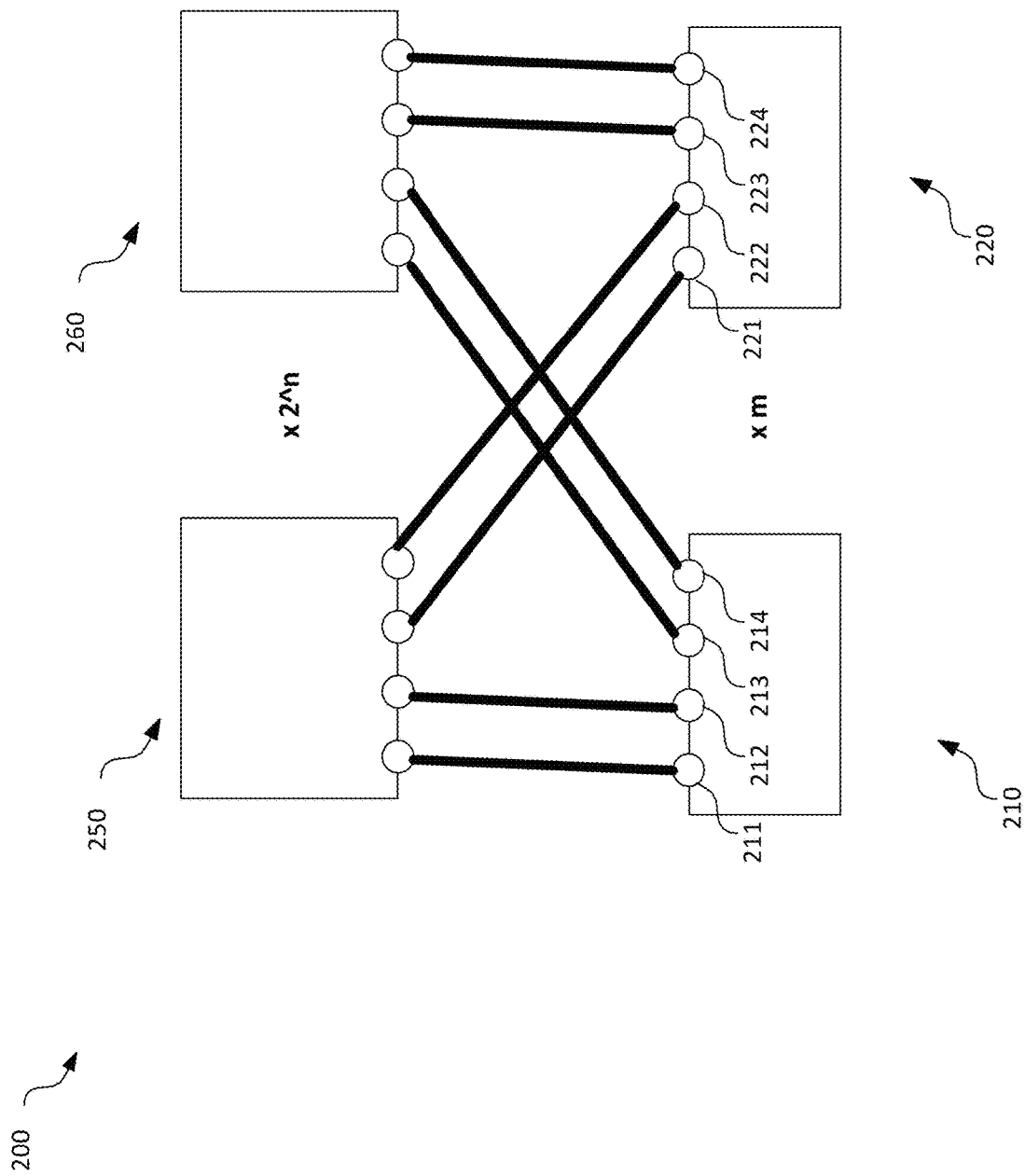
FIG. 2A illustrates a topology of network.

FIG. 2A illustrates a network 200 with PODs 210 and 220, and patch panels 250 and 260. POD 210 has ports 211-214 and POD 220 has ports 221-224. Although only 2 PODs are illustrated, it is to be understood that network 200 can have m PODs, each with d ports, and $2^n$ patch panels, where each patch panel can have $$\frac{d \times m}{2^n}$$

ports. In some examples, the number of ports between the PODs can vary, and be for example, 128, 256, or 512 ports. PODs 210 and 220 can be similar to the PODs described with reference to FIG. 1. Patch panels 250 and 260 can be similar to the patch panels described above with reference to FIG. 1. Solid black lines between the patch panels and PODs illustrate physical wiring or a physical link between PODs and patch panels. FIG. 2A illustrates a physical topology of network 200. The interconnections between the PODs and patch panels form a physical topology. The physical topology refers to the physical links connecting PODs with patch panels.

Figure 2B:
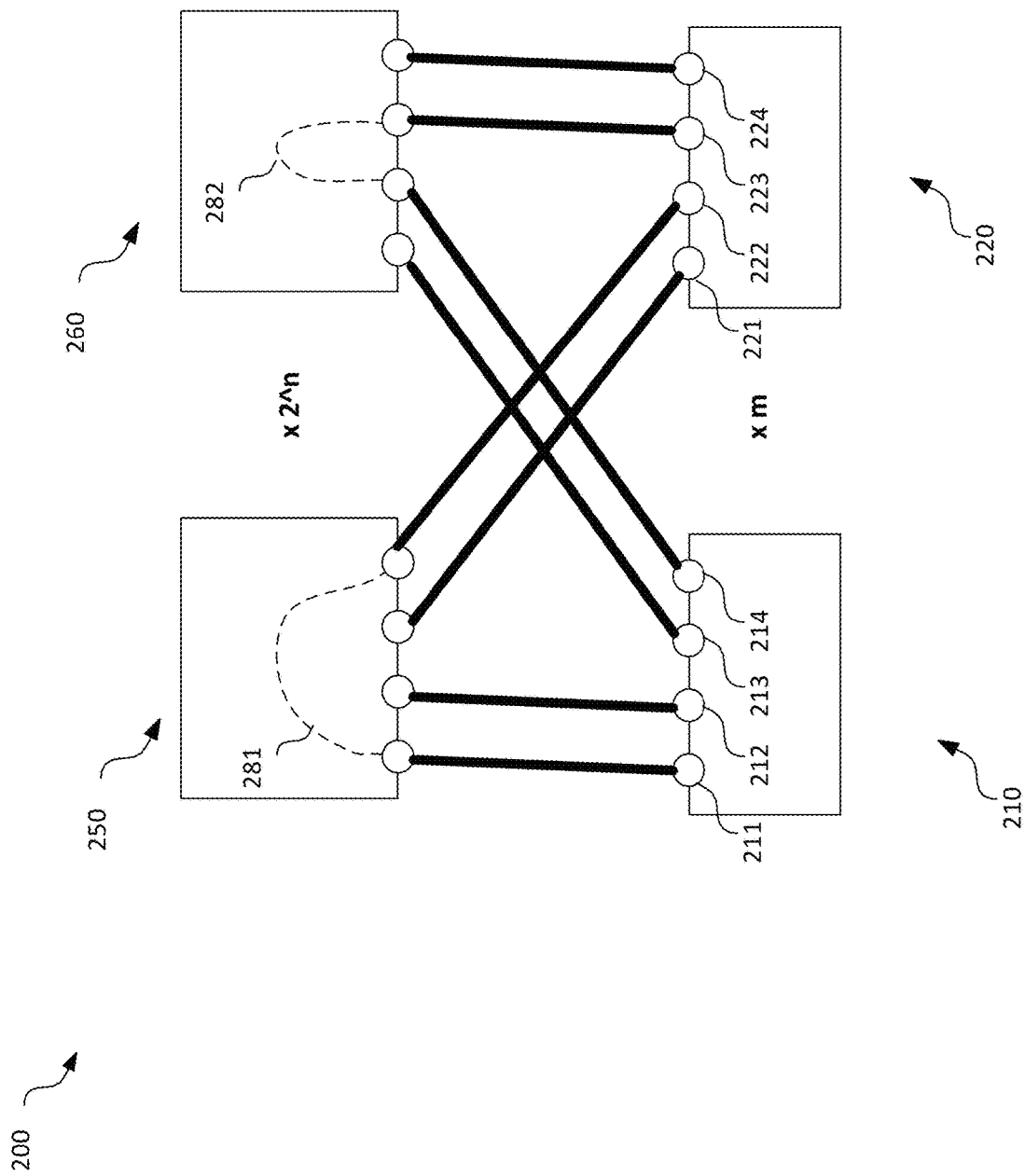
FIG. 2B illustrates a topology of a network including logical links within patch panels.

FIG. 2B illustrates network 200 FIG. 2A and components thereof, with internal logical links 281 and 282 of patch panels 250 and 260 respectively also illustrated in dotted lines. In some examples, the logical connection can be a physical link within a patch panel. Links 281 and 282 indicate which ports of PODs are connected with one another. In some examples, the links internally within the patch panel, such as link 281 and link 282, once modified, can affect the interconnectivity of two PODs. Stated in another manner, by modifying link 281 or link 282, the logical connection between the PODs can be altered without altering the physical wiring which exists between the PODs and a patch panel. For example, referring back to FIG. 1, an internal link within a patch panel can be changed to cause two different PODs to be connected through the patch panel. By altering, for example, the link within patch panel 170 to move from port 172 to port 171, POD 100 can be connected with POD 120 rather than POD 130.

Figure 2C:
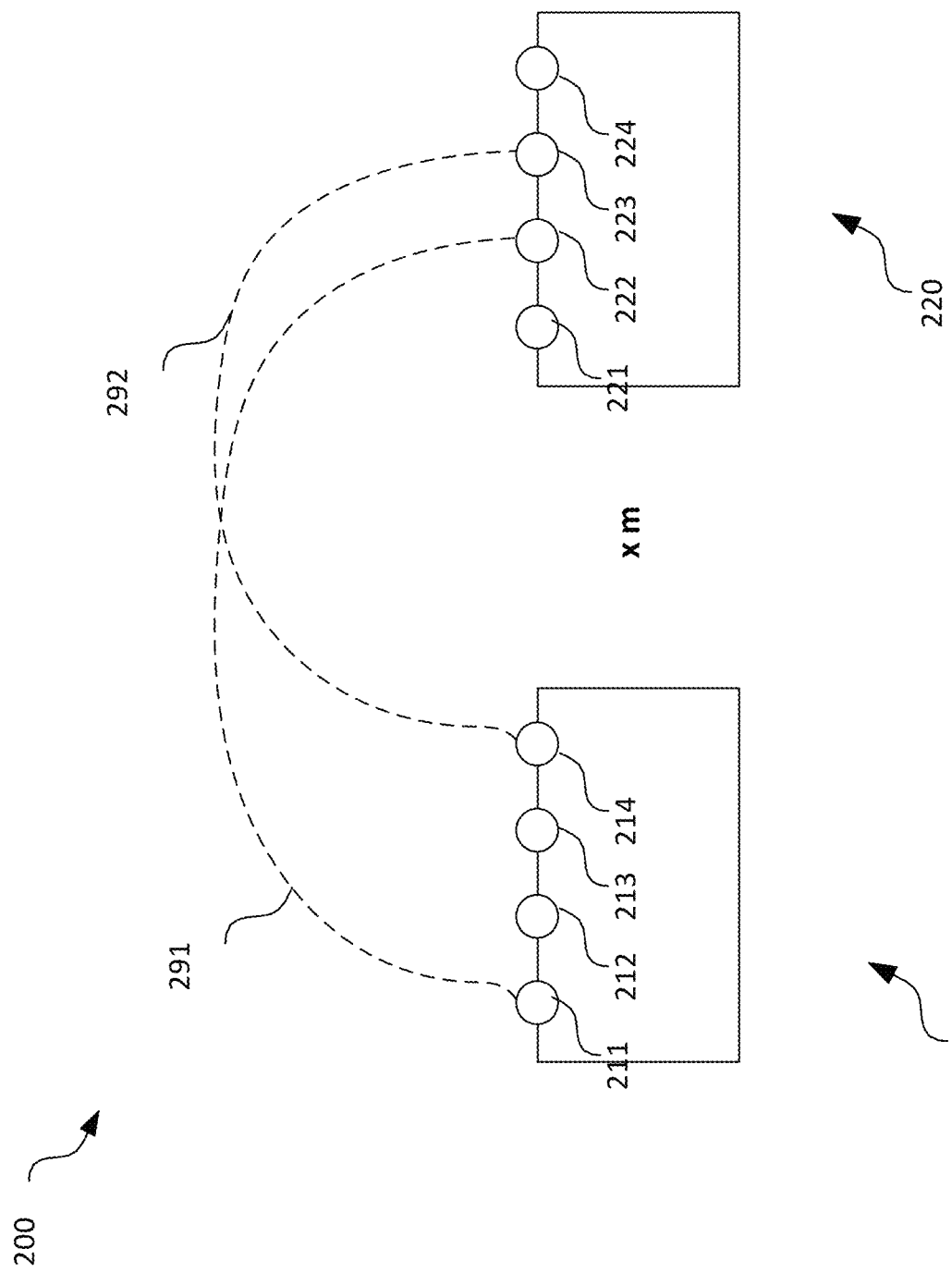
FIG. 2C illustrates an additional representation of a network at a logical level.

FIG. 2C illustrates network 200 of FIGS. 2A and 2B above an equivalent logical topology which can correspond to the physical topology described above. A logical topology is a set of logical links which connect a port in the patch panel to another port in the same patch panel. A logical topology over all patch panels can be thought of as a functional "system level" view of the data center as a whole. Although only two links are illustrated, a logical topology can consist of more than two logical links connecting ports within a network such that any logical link is in one to one correspondence with a set of two ports. As can be seen in FIG. 2C, a failure of a patch panel or link within the physical topology of a data center can be fatal to the operation of the data center.

A graph is generally thought of as a mathematical structure used to illustrate or conceptualize pairwise relationships between objects. A graph can consist of points, also known as nodes or vertices. An edge is a connection between two nodes, which indicates a relationship between the nodes. A graph typically has a single edge corresponding between any set of nodes whereas a multigraph may have multiple edges between a set of nodes. Within this disclosure, the network formed by PODs that are connected, from a logical perspective, may be represented using a graph or a multigraph. A person of skill in the art should understand that a graph can refer to various objects in graph theory, including for example, a multigraph.

Figure 3:
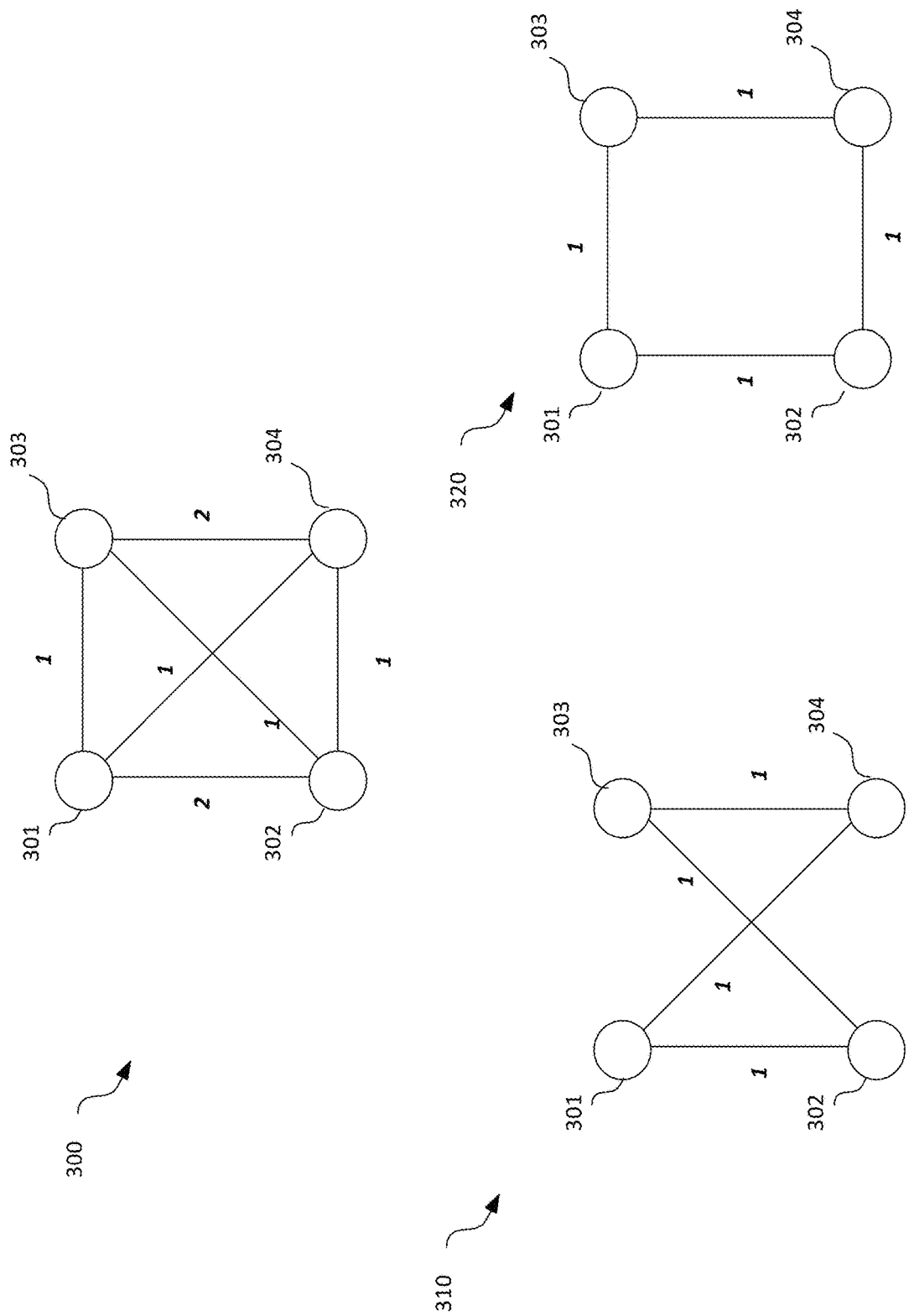
FIG. 3 illustrates multigraphs representing connections within a network.

FIG. 3 illustrates a multigraph representing connections between a plurality of PODs, graph 300. FIG. 3 also illustrates a graph 310 and 320. Graphs 300, 310, and 320 are shown with PODs 301-304 as nodes of the graph. Each POD can be similar to the PODs described above with reference to FIGS. 1, and 2A-2C. Although not illustrated, the PODs are connected to one another through patch panels, with such connections represented by the edges between nodes. Each line or edge between two POD represents the number of logical connections between any two PODs. For example, there are two logical connections between POD 301 and POD 302 represented by the number '2' on the side of the edge connecting the two. Graph 310 illustrates the connections made through a first patch panel while graph 320 illustrates connections made through a second patch panel. Graph 300 can be deconstructed or decomposed into graph 310 and 320. Collectively, graph 300 illustrates the total number of logical connections between any two nodes. As can also be seen in FIG. 3, there are no connections between POD 301 and POD 303 over the first patch panel. Similarly, there are no connections between POD 301 and POD 304 over the second patch panel.

Figure 4A:
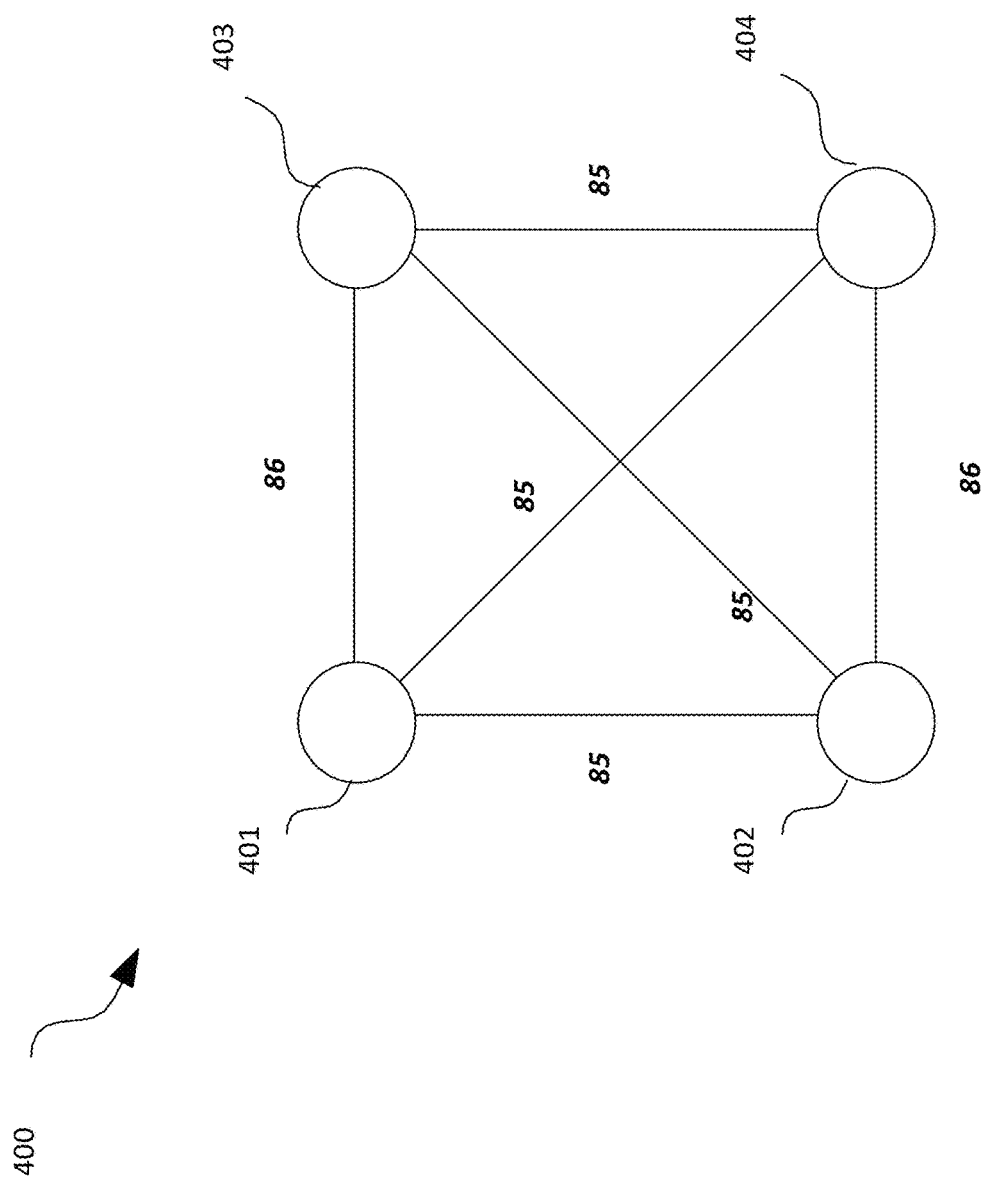
FIG. 4A illustrates a graphical representation of a network with inter-pod capacity intents illustrated on the edges of the graph.

FIG. 4A illustrates a graph 400 with PODS 401-404 and with inter-pod capacity intents between any two PODs illustrated as edges of graph 400. An "intent" can be thought of as the number of logical connections or logical links between two pods. In some examples, an intent can correspond to a logical link, such as link 281 or link 282, within a patch panel. An inter-pod capacity intent defines the number of logical links desired between any two pods. In some examples, the inter-pod capacity intent can be derived from design parameters of a network. In other examples, the inter-pod capacity intent can be decided by the number of ports in all PODs or by the demand in between PODs. For example, the intent between POD 401 and POD 402 is 85 and the intent between POD 401 and 403 is 86.

Figure 4B:
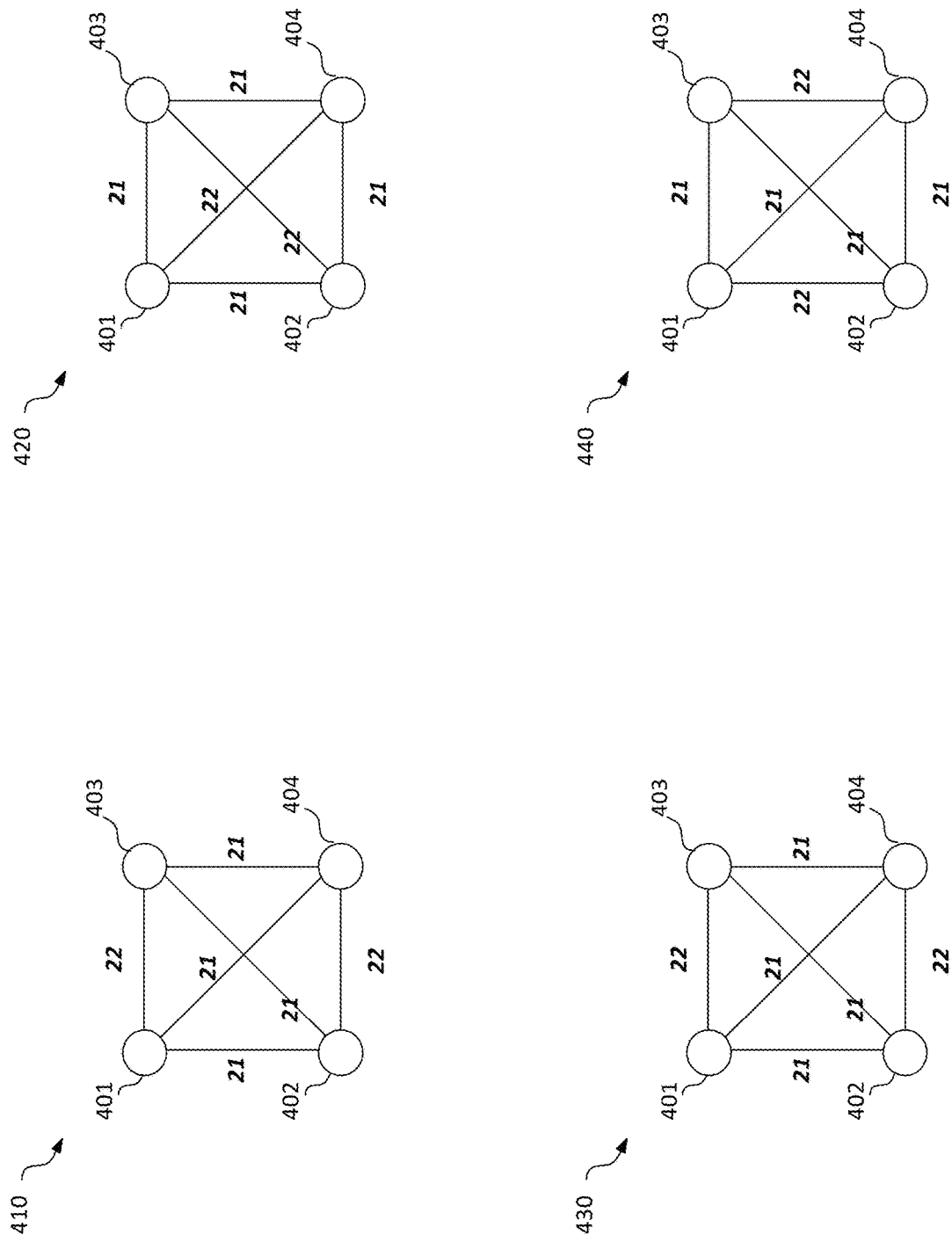
FIG. 4B illustrates a graphical representation of a network with inter-pod capacity intents illustrated on the edges of the graph.

FIG. 4B illustrates graphs 410, 420, 430, and 440 with PODS 401-404 as nodes of the graphs and with inter-pod capacity intents between any two PODs illustrated as edges of the respective graph. Each graph can illustrate an inter-pod capacity intent over a particular patch panel or a group of patch panels. Thus, graphs 410-440 illustrate the inter-pod capacity intents over four separate groups of patch panels. Although the patch panels are divided into 4 groups in this example, in general, $2^n$ patch panels can be divided into $2^k$ groups, where $1<=k<=n$, k and n are integers. Each group of patch panels can be thought of as a failure domain. In some examples, the failure domain can be a single patch panel. In other examples, a group of patch panels can be the failure domain. In some examples, multiple failure domains can be defined. In the example illustrated in FIG. 4B, the inter-pod capacity intent illustrated in FIG. 4A has been divided into 4 failure domains. The distribution of the inter-pod capacity intent between the failure domains can be done in a manner as close to equal as possible such that, in general, upon failure of one group of patch panels at most a $\frac{1}{2}^k$ capacity of the network is lost.

Although an inter-pod capacity intent is shown, a person skilled in the art should understand that the inter-pod capacity intent illustrated as graphs in FIGS. 4A-4B can have an equivalent to a logical topology. One or more logical topologies can correspond to a single inter-pod capacity intent. Stated in another way, an inter-pod capacity intent can have multiple logical topologies which satisfy the inter-pod capacity intent. A logical topology can correspond to more than one physical topology, or said alternatively, more than one physical topology can correspond to a single logical topology.

Figure 5:
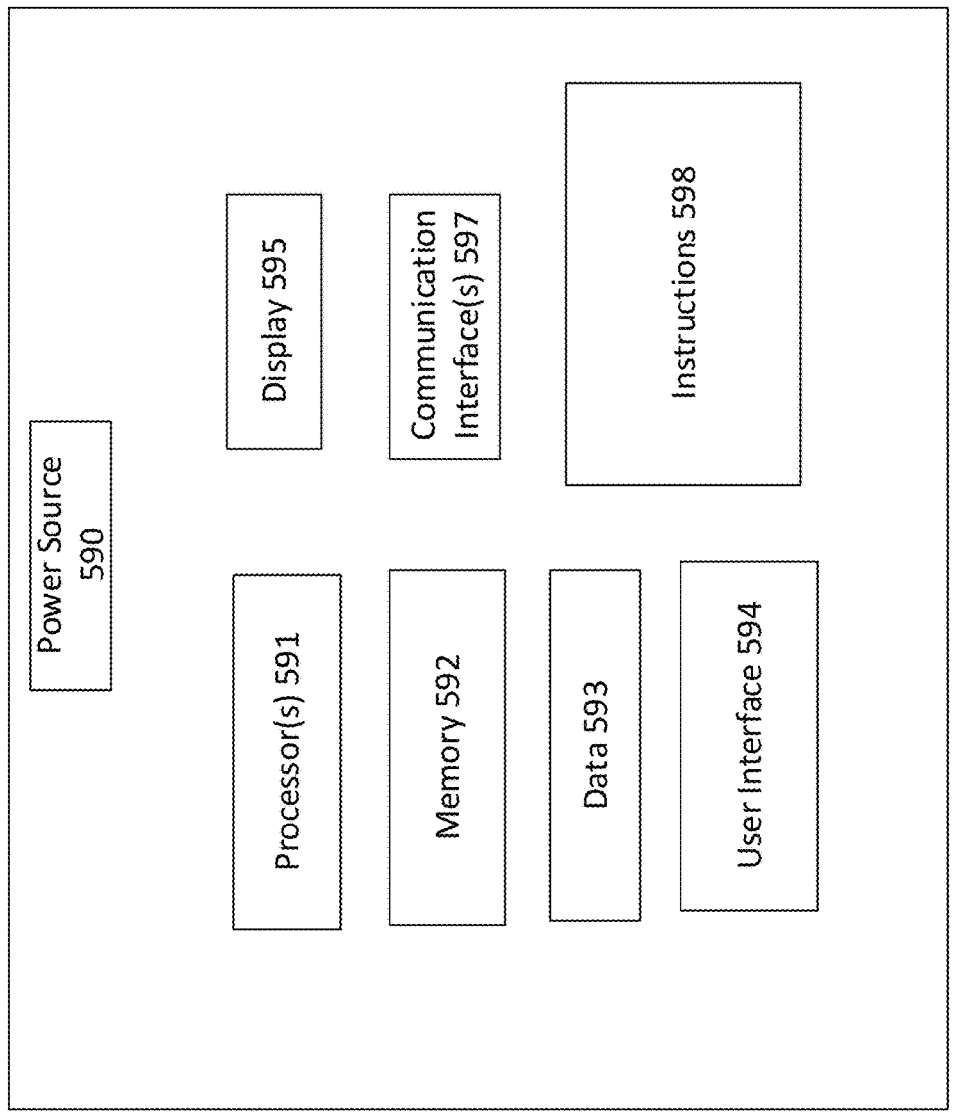
FIG. 5 illustrates aspects of a device 500

FIG. 5 illustrates aspects of a device 500. In some examples, device 500 can be a tablet, a smartphone, a smart watch, a laptop, a desktop, or a server. Device 500 may contain a power source 590, processor(s) 591, memory 592, data 593, a user interface 594, a display 595, communication interface(s) 597, and instructions 598. The power source may be any suitable power source to generate electricity, such as a battery, a chemical cell, a capacitor, a solar panel, or an inductive charger. Processor(s) 591 may be any conventional processor, such as commercially available microprocessors or application-specific integrated circuits (ASICs); memory, which may store information that is accessible by the processors including instructions that may be executed by the processors, and data. Memory 592 may be of a type of memory operative to store information accessible by the processors, including a non-transitory computer-readable medium, or other medium that stores data that may be read with the aid of an electronic device, such as a hard-drive, memory card, read-only memory ("ROM"), random access memory ("RAM"), optical disks, as well as other write-capable and read-only memories. The subject matter disclosed herein may include different combinations of the foregoing, whereby different portions of the instructions and data are stored on different types of media. Data 593 of device 500 may be retrieved, stored or modified by the processors in accordance with the instructions 598. For instance, although the present disclosure is not limited by a particular data structure, data 593 may be stored in computer registers, in a relational database as a table having a plurality of different fields and records, XML documents, or flat files. Data 593 may also be formatted in a computer-readable format such as, but not limited to, binary values, ASCII or Unicode. Moreover, data 593 may comprise information sufficient to identify the relevant information, such as numbers, descriptive text, proprietary codes, pointers, references to data stored in other memories—including other network locations, or information that is used by a function to calculate the relevant data.

Instructions 598 may control various components and functions of device 500. For example, instructions 598 may be executed to perform any of the methods indicated in this disclosure. In some examples, algorithms can be included as a subset of or otherwise as part of instructions 598 included in device 500. Instructions 598 can include algorithms to execute any of the methods or a subset of the methods described within this disclosure.

User interface 594 may be a screen which allows a user to interact with device 500, such as a touch screen or buttons. Display 595 can be an LCD, LED, mobile phone display, electronic ink, or other display to display information about device 500. User interface 594 can allow for both input from a user and output to a user. Communication interface(s) 597 can include hardware and software to enable communication of data over standards such as Wi-Fi, Bluetooth, infrared, radio-wave, and/or other analog and digital communication standards. Communication interface(s) 597 allow for device 500 to be updated and information generated by device 500 to be shared to other devices. In some examples, communication interface(s) 597 can send information stored in memory 592 to another user device for display, storage, or further analysis.

Example Methods

As explained below, the following methods can be used to find a new logical topology for a datacenter given a physical topology for the datacenter, such that:
 (1) The new logical topology is compatible with the physical topology.
 (2) The new pod-level multigraph, each multigraph representing the logical topology, summed over all patch panels is the same as the Inter-POD Capacity Intent.
 (3) The new logical topology satisfies failure domain constraints.
 (4) The intersection between new logical topology and the base logical topology is maximized.

In some examples, the methods and algorithms described herein can be performed on device 500.

In some examples, the methods described herein require a certain set of conditions, including (i) degree of each POD in POD-level intent is divided by the number of patch panels, and (ii) each POD in the physical topology has the same number of ports in each patch panel.

As used herein, a 2-partition describes a partition of a graph into 2 subgraphs. The 2-partition described herein may require that the degree of each POD is evenly distributed into two subgraphs. For example, if a POD has a degree of 64 when conceptualized as a multi-graph, the two subgraphs obtained after a 2-partition of that POD would both have a degree of 32.

Figure 6:
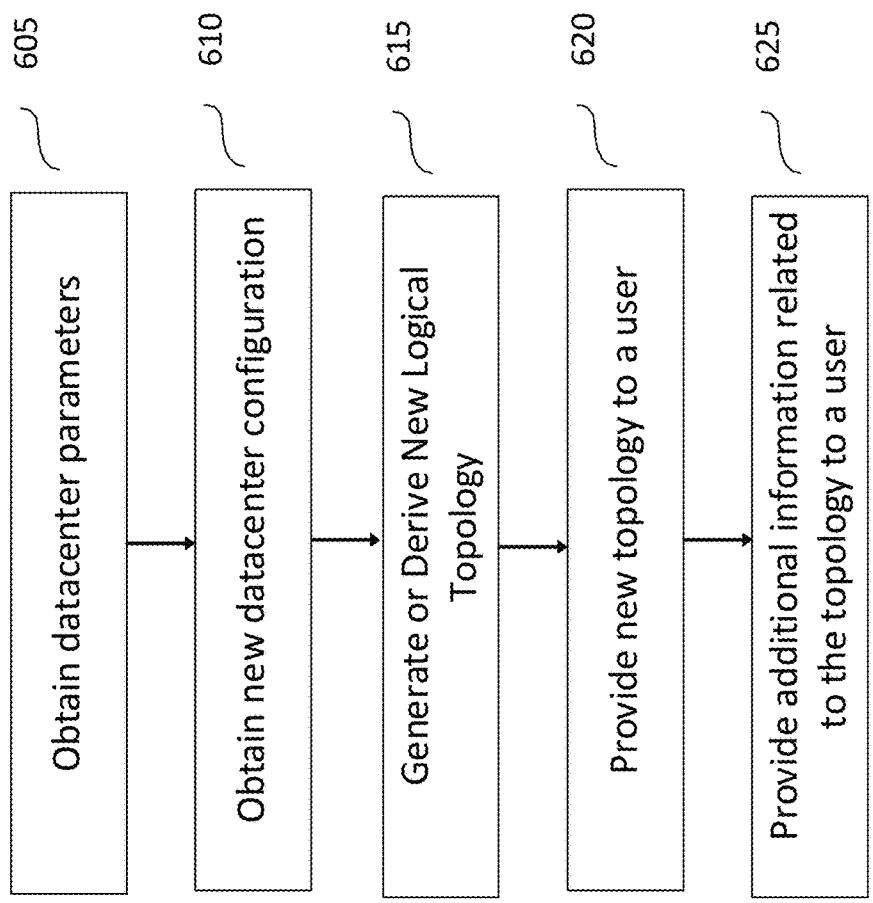
FIG. 6 illustrates aspects related to an example method of determining a new logical topology.

FIG. 6 illustrates a flowchart of an example method 600 of determining a physical topology through a patch panel for a provided inter-pod capacity intent. As explained above, in some examples, determining a physical topology through a patch panel can also consist of determining a set of physical port connections to satisfy a physical topology. In other examples, determining a physical topology can consist of determining the existing physical links between the PODs and the patch panels.

In some examples, datacenter parameters are fixed over time. However, in some examples, some datacenter parameters, such as for example the physical connections between PODs and patch panels, may change. The steps described in this disclosure can occur after the physical topology change is made or if the new or updated physical topology is known.

For example, if a new POD is added to the network, the physical connections between the PODs and patch panels will change. In such an example, it may be necessary to physically connect the new POD to all the patch panels.

In another example, upon upgrading the radix of a POD, the physical topology can change. For example, the radix of a topology can double from 256 to 512. In this example, the number of physical links between the upgraded POD and each patch panel may need to be doubled. The physical topology can be determined after this change occurs. In other examples, if the specific plan for physical links is already known, the anticipated physical topology can be determined.

In another example, one or more PODs can be removed from a datacenter network. In this example, the physical links without the POD can be determined. In some examples, using the determined physical topology without the links, the methods described herein can be used to determine a logical topology corresponding to the new physical topology. Upon changing the logical topology based on the determined new physical topology, the one or more PODs can be physically removed from the network. By removing the one or more PODs after changing the logical topology, the network can continue to be used during the removal of the one or more PODs from the network.

In some examples, a patch panel expansion can occur. For example, it may be needed to double the number of Patch Panels in order to connect more PODs. As explained herein, we can remove all the logical links in a failure domain, double the number of patch panels in the failure domain, reconnect all the physical links between PODs and the failure domain, and create a new logical topology for that specific failure domain. In this example, the remainder of the network can be used as only one failure domain is being upgraded at a given time.

At block 605, one or more datacenter parameters can be obtained. A datacenter can be a network similar to those described above with reference to FIGS. 1-4B. The datacenter parameters can include information about the existing state or configuration of the datacenter. This can include for example, information about existing physical topology of a datacenter. As explained above, the physical topology of a datacenter includes information about the ordered pairs or set of connections between the ports on PODs of the datacenter and ports on the patch panels of the datacenter. The physical topology can also include information about the existing number of PODs within the datacenter, the number of patch panels within the datacenter, the number of ports of both the PODs and the patch panels, and a set of connections between the ports of the PODs and the ports of the patch panels. The datacenter parameters can also include information about the existing logical topology of the network as well.

At block 610, a new datacenter configuration can be obtained. In some examples, the new datacenter configuration is information about an inter-pod capacity intent. As described above, the inter-pod capacity intent is a system level view of the number of connections between two PODs of a datacenter. In some examples, a new datacenter configuration will include information about a desired logical topology for the datacenter. In some examples, the new datacenter configuration can be information about desired parameters of the datacenter. In other examples, a new datacenter configuration will only include information about the datacenter from which a logical topology can be derived.

At block 615, a new logical topology can be derived based upon the inter-pod capacity intent which is compatible with the physical topology of the datacenter. The new logical topology for the network can be derived such that the inter-pod capacity intent is met by the new logical topology. In some examples, the new logical topology derived can further meet other constraints in terms of failure domains. In other examples, the new logical topology can ensure that the intersection between the new logical topology and the base logical topology provided is maximized. Additional details for block 615 are further discussed below with reference to FIG. 7.

At block 620, the new logical topology derived in block 615 can be provided to a user device. In some examples, the device can be similar to device 500 described above. In other examples, the device can be a user device such as a tablet, cell phone, smartphone, or other device. In some examples, the new logical topology can be stored as a set of human readable instructions which are provided to a device.

At block 625, additional information related to the new logical topology can be provided to a user device. In some examples, this additional information can be information related to the device such as a set of instructions on specific patch panels to reconfigure or rearrange to create a physical topology equivalent to the new logical topology generated in the previous blocks. For example, the set of instructions can indicate which internal links within one or more patch panels are to be rearranged to form the logical links which collectively create the new logical topology. In some examples, the set of instructions can indicate which physical connections between ports of a POD and a patch panel are to be removed or added to form or make feasible the new logical topology. In other examples, it may comprise a wiring plan that forms a set of instructions for rewiring the cables connecting patch panels. It may also comprise a set of logical connections that need to be implemented within the data center. The logical connections may comprise output from a computing device that is used to automatically update the logical connections of certain patch panels and PODs within a data center.

In some examples, additional information related to the set of reconfigurations can be stored as human-readable instructions. In other examples, the datacenter can be configured such that, upon performing a reconfiguration according to the set of reconfigurations, an indication or message can be sent to a user device to indicate whether a logical link or logical connection has been successfully reconfigured in accordance with the set of instructions. In some examples, an entire map or topology can be displayed to a user, and updated in real time.

In other examples, a difference can be computed between the old logical topology and the new logical topology in each failure domain. The difference can include the set of old logical links, the set of common links, and the set of new logical links. The logical topology change can be provided by a specific failure domain. A user can be provided with information related to one failure domain at a time. The user can be instructed to first remove all old logical links and after removal of all old logical links, reconnect with the new logical links. The process can be repeated for each failure domain at a time to reconfigure the entire network.

Figure 7:
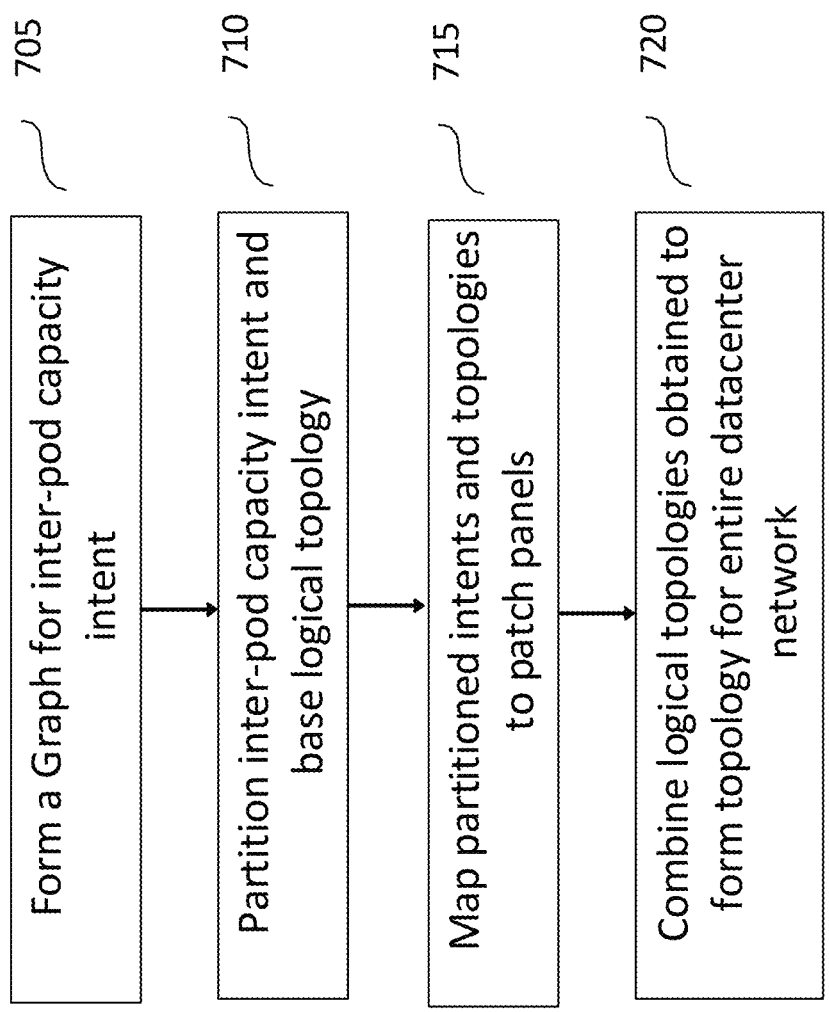
FIG. 7 illustrates a flowchart of an example method 700 of determining a new logical topology.

FIG. 7 illustrates a flowchart of an example method 700 of determining a new logical topology. The steps of method 700 can be used in conjunction or as part of the steps of method 600. As explained above in reference to method 600 and FIG. 6, characteristics about the datacenter including the number and links within patch panels, the physical topology and connections between PODs and patch panels, and the desired inter-pod capacity intent are known. Although portions of method 700 are described in terms of graph theory and integer programming problems, it is to be understood that equivalent mathematical techniques and formulations are possible.

At block 705, an equivalent graph for the given inter-pod capacity intent can be formed. As explained above, an inter-pod capacity intent can be represented as a mathematical graph. Mathematical descriptions of describing an inter-pod capacity intent as a mathematical graph are described herein.

At block 710, the inter-pod capacity intent and base logical topology, which are provided as inputs above, can be partitioned. The inter-pod capacity intent can be divided into a number of intents equal to the number of patch panels. In some examples, the inter-pod capacity intent can be divided into $2^n$ pod-level intents, where $2^n$ is also the number of patch panels. In some examples, the division can occur as consecutively or sequentially partitioning the inter-pod capacity intent. Details of how to partition inter-pod capacity intent and base logical topology of block 710 are provided below. In some examples, the partition can be achieved by solving $2^n-1$ number of two-partition problems.

In other words, the patch panels can be evenly partitioned into two groups. The original pod-level intents provided can also be divided into two groups of pod-level intents. Each of these groups can be mapped or assigned to another. For each group, this process can be recursively performed until the pod-level intents or the patch panels can no longer be divided.

At block 715, the $2^n$ pod-level intents obtained in block 710 can be mapped to the $2^n$ base logical topologies of the patch panels can be used as inputs, and both the intents and the base logical topologies can be mapped into corresponding patch panels. Details of the mapping are provided below. In other words, a "base problem" is obtained in which, given a patch panel and a POD-level intent, find a logical topology for the given patch panel such that the corresponding POD-level graph over the given patch panel is the same as the input integral graph. The input integral graph can be a graph corresponding to a pod-level intent graph, or can be one of the $2^n$ pod-level intents obtained in block 710. An example is provided below with reference to FIG. 9 for one patch panel within a datacenter. In this step, the "base problem" corresponding to a patch panel can be solved.

At block 720, the logical topologies obtained in block 715 can be summed or combined, to find a logical topology over all patch panels for the datacenter. Details of this summation or combination are provided below. In some examples, only a portion of the patch panels can be summed.

In some examples, the number or a group of failure domains which can be worked or modified at a given time can be provided to a user. For example, if all failure domains can be worked upon at one time, this information can be provided to a user. In other examples, if only a subset of failure domains can be used or worked upon at a given time, that information can be provided to a user.

Example Algorithms, Equations, Formulations and Methods
Example Methods to Partition of Inter-POD Capacity into $2^n$ Intents In a given datacenter, assume that there are $2^n$ number of patch panels. A given inter-pod capacity is to be divided into $2^n$ number of capacity intents and assign each intent to one patch panel. Each capacity intent over one patch panel will be used to connect the ports in the corresponding patch panel. An example process is to recursively partition m capacity intents into 2*m capacity intents until $2^n$ capacity intents are obtained. The process can be further divided into 2 stages. In the first stage, the capacity intent over all patch panels can be partitioned into $2^k$ capacity intents over $2^k$ failure domains. Each intent is assigned to one failure domain. In the second stage, $2^k$ capacity intents can be partitioned into $2^n$ capacity intents. Each of the $2^n$ capacity intents can be assigned to one patch panel.

In each stage, the partition problem can be repeatedly divided into two sub-problems. In each divide process or 2-partition problem, there can be two problems to solve—a patch panel partition problem and a graph partition problem.

Patch panels partition problem. The patch panels are evenly partitioned into two groups. The partition can be arbitrary as long as each group has the same number. If the Failure Domain constraint is needed, the failure domains will be partitioned into two groups evenly. As explained herein, each failure domain can correspond to a set of logical links.

Capacity intent partition problem. The capacity intent is evenly partitioned into two sub-intents. In other words, the degrees of the original intent are evenly partitioned. If the Failure Domain constraint is needed, the capacity intent will be partitioned into two intents balancedly. Balancedly can refer to dividing the intent to as close as evenly as possible, such that, for each pair of PODs, the numbers of edges connecting two PODs in two subgraphs will differ by at most 1.

Theorem 1, below, guarantees that a feasible partition can always be found in polynomial time for this intent partition problem. Proof of Theorem 1 is provided below. Let G be a multigraph. Let $e_G(i,j)$ be the number of edges between vertex i and j. Let $d_G(i)$ be the degree of i. Graph G can be a graph of the inter-pod capacity intent, which can be divided or partitioned into sub-graphs.

Theorem 1: Let G be a multigraph with $2|d_G(i)$, $\forall i \in V(G)$. If every component of G has an even number of edges, then G can be partition into $f_1, f_2$ in polynomial time, such that $$d_{f_1}(i) = d_{f_2}(i) = \frac{d_G(i)}{2}, \forall i \in V(G).$$

It is assumed that the patch panels have non-empty logical links and the patch panels are partitioned into two groups. Then each group of patch panels induces a POD-level graph over this group of patch panels. Let $B_1$ and $B_2$ be the POD-level graphs over two groups of patch panels. For the purpose of minimal restriping, the methods described herein will find an optimal partitioning of intent, G, into $G_1$ and $G_2$ such that the partition maximize the intersection between $G_1$ and $B_1$ as well as the intersection between $G_2$ and $B_2$.

In some examples, an integer linear programming model for creating the partitioning can be used to solve or provide a partitioning described in Theorem 1.

Example Integer Linear Programming Model for Partitioning Described in Theorem 1

The integer linear programming model can have a number of variables and constraints as described below. It is understood that this mathematical model represents various aspects of a datacenter as described within this disclosure. In some examples, the integer linear programming can be solved algorithmically on device 500.

Variables $x^k_{ij}$: number of logical links between pod i and j (integer variables) in sub intent $G_k$ ($k \in \{1,2\}$).

Objective $$\text{Max} \sum_{i,j,k} \min\{x^k_{ij}, e_{B_k}(i,j)\}$$

The objective is used for restrip can refer to minimizing the number of logical connections, or links, such as those links 271-272.

Constrains $$x^k_{ij} <= e_G(i,j), \forall i,j \in V(G), \forall k \in \{1,2\} \quad (1)$$

Bound the number of edges between two pods in a sub intent $$x^1_{ij} + x^2_{ij} = e_G(i,j), \forall i,j \in V(G) \quad (2)$$

Edges are partitioned into two sub intents.

$$\sum_j x^k_{ij} = d_G(i)/2, \forall i \in V(G), \forall k \in \{1, 2\} \quad$$

(3) Degree is evenly partitioned into two sub intents.

Example of Partition Capacity Intent by Failure Domain

When partitioning a capacity intent by Failure Domain, the intent is partitioned into two sub-intents: $G_1$, $G_2$, such that the 2-partition is balanced over 2 sub-intents. More precisely, the edges between any two nodes are evenly distributed over 2 sub-intents. A 2-partition is balanced over 2 sub-intents if $\forall i,j \in V(G)$, $|e_{G_1}(i,j) - e_{G_2}(i,j)| <= 1$, where $e_{G_1}(i,j)$ is the number of edges between block i and block j in $G_1$ and $e_{G_2}(i,j)$ is the number of edges between block i and block j in $G_2$.

Figure 8:
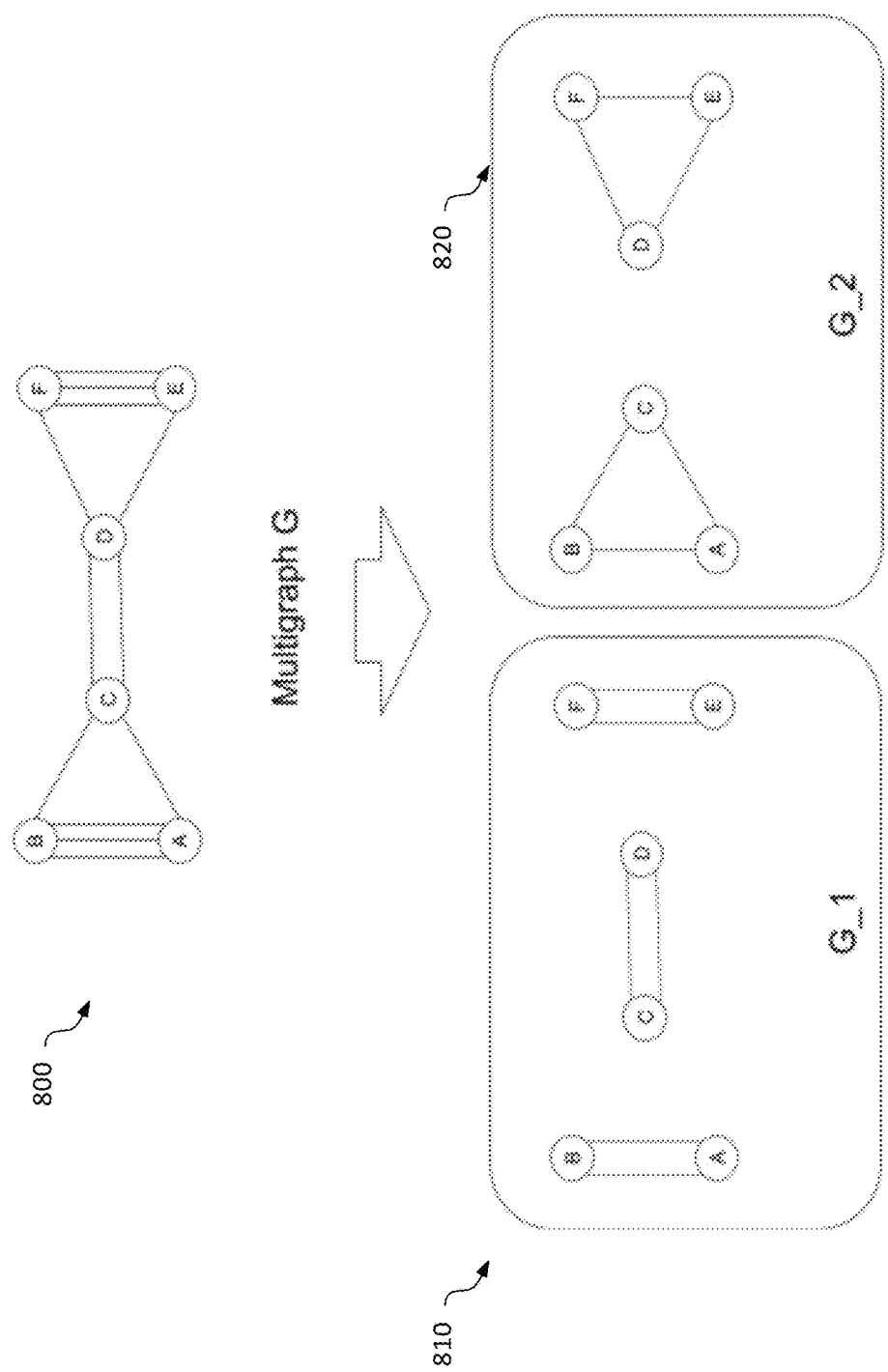
FIG. 8 illustrates an example case in which it is impossible to find a balanced 2-partition.

FIG. 8 illustrates an example case in which it is impossible to find a balanced 2-partition. FIG. 8 illustrates a multigraph 800 which partitioned unevenly into graphs 810 and 820. Theorem 2 below shows that when a balanced partition does not exist, it is possible to find an "almost" balanced partition.

Theorem 2: Let G be a multigraph with $4|d_G(i)$, $\forall i \in V(G)$. Let v be the number of vertices in G. Then G can be partition into $G_1$, $G_2$ in polynomial time, such that

1.

$$d_{G_1}(i) = d_{G_2}(i) = \frac{d_G(i)}{2}, \forall i \in V(G)$$

and $|e_{G_1}(i,j) - e_{G_2}(i,j)| <= 2$, $\forall i,j \in V(G)$

2. If G is randomly generated, then with probability $$1 - o\left(\frac{v}{2^{v-1}}\right),$$

$|e_{G_1}(x,y) - e_{G_2}(x,y)| <= 1$, $\forall x,y \in V(G)$.

3. There at most $\lfloor v/3 \rfloor - 1$ pairs of vertices (i,j), where $|e_{G_1}(i,j) - e_{G_2}(i,j)| = 2$.

Assume that the patch panels have non-empty logical links and the patch panels are partitioned into two groups. Let $B_1$ and $B_2$ be the POD-level graphs over two groups of patch panels. For the purpose of minimal restripe, the Algorithm will find an almost balanced partition of capacity intent, G, into $G_1$ and $G_2$ such that the partition maximize the intersection between $G_1$ and $B_1$ as well as the intersection between $G_2$ and $B_2$. The Algorithm will firstly guarantee all the properties in Theorem 2 and then try minimal restripe. The algorithm can consist of the following steps:

1. Assume that G is connected (if not, run the algorithm on each component independently)
2. Decompose G into $G_m$, $G_r$, where $V(G) = V(G_m) = V(G_r)$ and $e_{G_r}(x,y) = e_G(x,y) \% 2$, $e_{G_m}(x,y) = e_G(x,y) - e_{G_r}(x,y)$, $\forall x,y \in V(G)$.
3. As $G_r$ is constructed by subtracting an even number of edges from $e_G(x,y)$, the degree of x stays even in $G_r$. So $2|d_{G_r}(x)$, $\forall x \in V(G_r)$
4. A connected component of $G_r$ is odd if there are an odd number of edges in this component. If there are some odd components in $G_r$, it is possible to move 2 edges from $G_m$ to $G_r$ for some pairs of vertices, such that $G_r$ has no odd component. The edges can always be found in the following way. Let $c_1, c_2, \ldots, c_k$ be the components of $G_r$. As G is connected, there exists pairs of vertices, where adding 2 edges to those pairs will make $G_r$ connected. By the minimum spanning tree algorithm, it is possible to find k-1 pairs which makes $G_r$ connected.
5. Apply ILP Model for Partition to partition $G_r$ into $G_{r_1}$, $G_{r_2}$. As each block pair has at most 2 edges, we have $|e_{G_{r_1}}(x,y) - e_{G_{r_2}}(x,y)| <= 2$, $\forall x,y \in V(G)$
6. Partition $G_m$ into $G_{m1}$, $G_{m2}$, such that $e_{G_{m1}}(x,y) = e_{G_{m2}}(x,y) = e_{G_m}(x,y)/2$, $\forall x,y \in V(G)$.
7. Combine the partition. Make $G_1 = G_{r1} \uplus G_{m1}$ and $G_2 = G_{r2} \uplus G_{m2}$. Then G is partitioned into $G_1$, $G_2$.

Example Partition of $2^k$ Capacity Intents into Patch Panel Level Capacity Intents After application of theorem 2, $2^k$ capacity intents can be partitioned into $2^n$ graphs. Each intent is partitioned into $2^n/2^k$ intents. As diversity is not needed, it is possible to recursively use the integer linear programming formulation for partitioning described above. Diversity can refer to the need to partition the graph balancedly, as described above.

Example Mapping of Capacity Intent into Port-Level Topology

After all the 2-partitions, $2^n$ capacity intents can be obtained. For each intent, a port-level Topology for the corresponding patch panel can be found such that the POD-level graph over the patch panel is the same as the input intent.

Let G be the Capacity Intent assigned to any specific patch panel and B be the POD-level graph over that specific patch panel. The following steps can be performed to map the capacity intent into the port-level topology:

For all (i,j) pairs, keep min{$e_G(i,j)$, $e_B(i,j)$} logical links between block i and block j and remove other logical links between block i and block j.

For all (i,j) pairs, use max{$e_G(i,j)-e_B(i,j)$, 0} free ports and max{$x_{ij}-e_B(i,j)$, 0} free ports to connect block i to block j.

Figure 9:
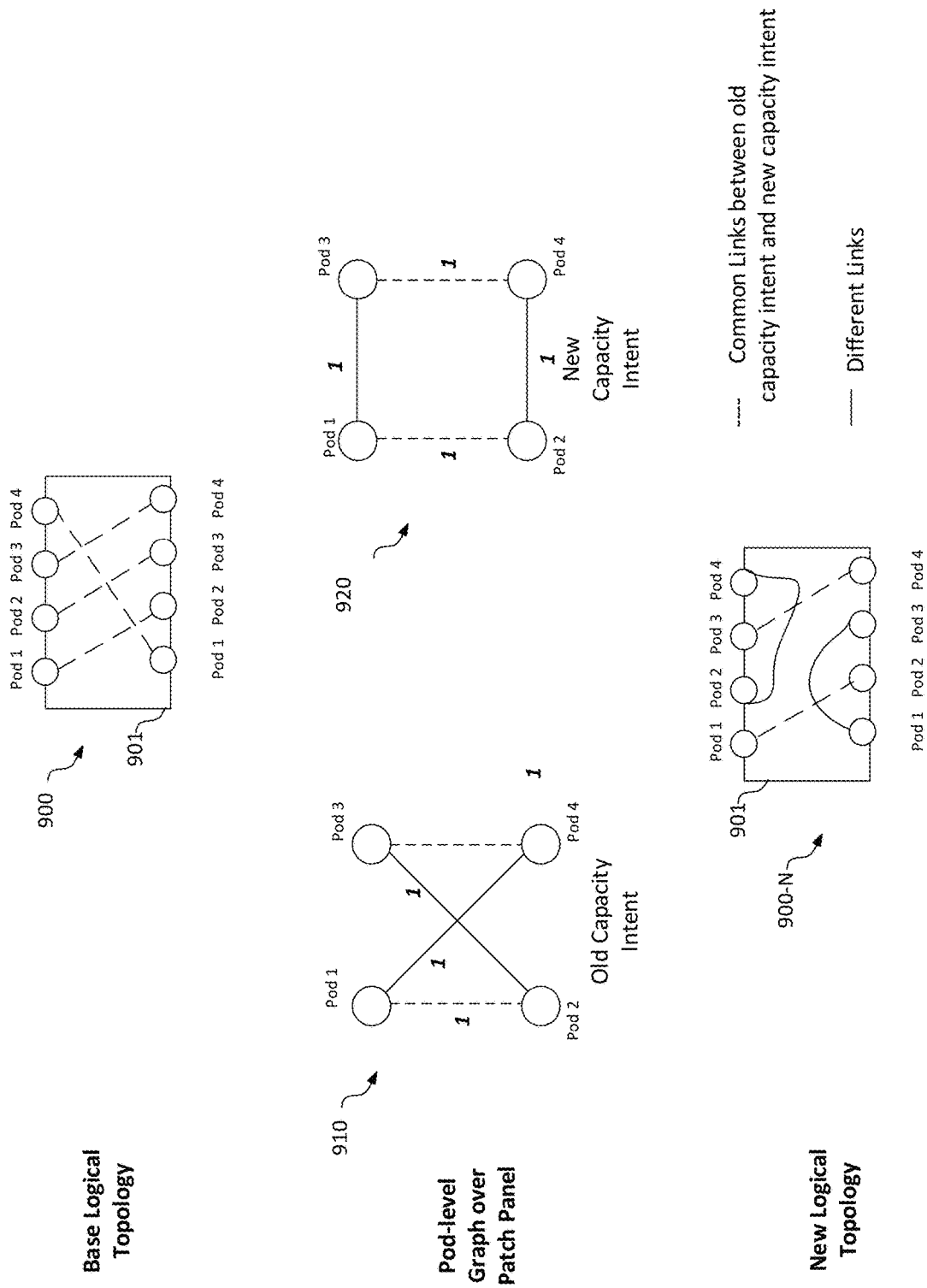
FIG. 9 illustrates an example of mapping capacity intent to port-level topology.

FIG. 9 illustrates an example of mapping capacity intent to port-level topology. FIG. 9 illustrates an existing logical topology 900 with links within a patch panel 901. The links illustrated in dashed lines within FIG. 9 illustrate the logical level view of how topology 900 links 4 example PODs, PODs 1 to POD 4. The old capacity intent 910 is illustrated with solid and dashed lines and similarly the new capacity intent 920 is illustrated with solid and dashed lines. The dashed lines indicate the common links between the old capacity intent 910 and the new capacity intent 920. The solid lines indicate the links which differ between intent 910 and intent 920. 900-N illustrates patch panel 900 after mapping the capacity intents into the port-level topology. The solid lines within 900-N indicate "old" or previously existing links, whereas the solid lines indicate new links created to satisfy the new capacity intent over the patch panel 900.

While this disclosure contains many specific implementation details, these should not be construed as limitations on the scope of what may be claimed, but rather as descriptions of features specific to particular implementations. Certain features that are described in this specification in the context of separate implementations may also be implemented in combination in a single implementation. Conversely, various features that are described in the context of a single implementation may also be implemented in multiple implementations separately or in any suitable sub-combination. Moreover, although features may be described above as acting in certain combinations and even initially claimed as such, one or more features from a claimed combination may in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

References to "or" may be construed as inclusive so that any terms described using "or" may indicate any of a single, more than one, and all of the described terms. The labels "first," "second," "third," and so forth are not necessarily meant to indicate an ordering and are generally used merely to distinguish between like or similar items or elements.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein.

Brief Sketch of Proof Related to Theorem 1
1. Assume that G is connected. If not, run the following in each component of G.
2. Find an Euler Tour T of G.
3. Color every second edge of T blue and the remaining edges red.
4. As the number of edges is an even number, the number of red edges is the same as the number of blue edges and there are no two consecutive edges with the same color in T.
5. For each vertex i, T visits it $$\frac{d_G(i)}{2}$$

times. In each visit of i, one edge get into i and one edge get out of i. Thus, One is a red edge and the other one is a blue edge.

6. For each vertex i, half of the edges incident to i is colored blue and the other half of the edges incident to i is colored red.
7. The graphs induced by red and blue edges have degree $$\frac{d_G(i)}{2}, \forall i \in V(G).$$

Brief Sketch of Proof Related to Theorem 2
Proof of Part 1.
1. Assume that G is connected (if not run the algorithm on each component independently)
2. Decompose G into $G_m$, $G_r$, where $V(G)=V(G_m)=V(G_r)$ and $e_{G_m}(x,y)=e_G(x,y) \% 2$, $e_{G_r}(x,y)=e_G(x,y)-e_{G_m}(x,y)$, $\forall x,y \in V(G)$.
3. As $G_r$ is constructed by subtracting an even number of edges from $e_G(x,y)$, the degree of x stays even in $G_r$. So $2|d_{G_r}(x)$, $\forall x \in V(G_r)$.
4. A connected component of $G_r$ is odd if there are an odd number of edges in this component. If there are some odd components in $G_r$, it is possible to move 2 edges from $G_m$ to $G_r$ for some pairs of vertices, such that $G_r$ has no odd component.
5. Apply Theorem 1 to partition $G_r$ into $f_{r1}, f_{r2}$. As each block pair has at most 2 edges, it follows that $|e_{f_{r1}}(x,y)-e_{f_{r2}}(x,y)|<=2$, $\forall x,y \in V(G)$
6. Partition $G_m$ into $f_{m1}, f_{m2}$, such that $e_{f_{m1}}(x,y)=e_{f_{m2}}(x,y)=e_{G_m}(x,y)/2$, $\forall x,y \in V(G)$.
7. Combine the partition. Make $f_1=f_{r1} \cup f_{m1}$ and $f_2=f_{r2} \cup f_{m2}$. Then G is partitioned into $f_1, f_2$.

Proof of Part 2.
It can be shown with mathematically rigorous high probability, $G_r$ is connected in step 4.a. Since $G_r$ has an even number of edges, $G_r$ has no odd component. Note that Pr ($G_r$ is connected)<Pr ($G_r$ has no odd component). High probability is intended as the result is more probably as $v \to \infty$ Assume that G is randomly generated. For any pair of vertices, (x,y), the probability that (x,y) has an edge in $G_r$ is ½. $G_r$ can be considered as a randomly generated simple graph by the Erdös-Rényi model G(v,p), with p=½. It has been shown that as $v \to \infty$, Pr ($G_r$ is connected)$\to 1-v/2^{v-1}$.

Proof of Part 3.
It can be shown and proved that at most, most $\lfloor v/3 \rfloor-1$ pairs of vertices in step 4 need to be modified.

Let $c_1, c_2, \ldots, c_k$ be the components of $G_r$. As the degree of $G_r$ is even, each component of $G_r$ has at least 3 vertices. Thus, $k<=\lfloor v/3 \rfloor$.

As G is connected, there exists pairs of vertices, where adding 2 edges to those pairs will make $G_r$ connected. By the minimum spanning tree algorithm, it is possible to find k−1 pairs which makes $G_r$ connected.

Aspects of the disclosed technology include any combination of the following features:

¶1. A method of reconfiguring a network, the method comprising:
   determining a first network topology, the first network topology comprising:
   a first set of physical connections, each physical connection created between a port on a point of delivery (POD) and a port on a patch panel;
   a first set of logical connections within each patch panel of the network;
   receiving a set of capacity intents, each capacity intent within the set of capacity intents corresponding to each pair of PODs within the network; and
determining with one or more computing devices a set of reconfigurations to logical links within each patch panel of the network to generate a second network topology;
wherein the second network topology comprises a logical topology for each patch panel in the network, each logical topology corresponding to a pod-level multigraph, and in which the summation over all pod-level multigraphs for the second network topology is equal to the received set of capacity intents.

¶2. The method of ¶¶1 wherein the first network topology is represented as a multigraph.

¶3. The method of ¶¶1-2 wherein the set of reconfigurations of logical links approximates a minimal or smallest number of reconfigurations within the set of reconfigurations to the logical links.

¶4. The method of ¶¶1-3 wherein the set of reconfigurations does not alter the existing physical connections of the network.

¶5. The method of ¶¶1-2 further comprising generating instructions related to the set of reconfigurations.

¶6. The method of ¶¶1-5 further comprising sending the set of instructions related to the set of reconfigurations to a user device.

¶7. The method of ¶¶6 further comprising the set of instructions related to the set of reconfigurations being stored as human-readable instructions.

¶8. The method of ¶¶6-7 further comprising receiving, at a user device, an indication that a reconfiguration from the set of reconfigurations of a logical link has successfully been reconfigured.

¶9. The method of ¶¶1-8 wherein the computing device recursively 2-partitions the second network topology as part of determining a set of reconfigurations of logical links.

¶10. The method of ¶¶1-9 wherein the second network topology satisfies a failure domain constraint for the network.

¶11. A non-transient computer readable medium containing instructions, the instructions when executed perform the steps of:
determining a first network topology, the first network topology comprising:
   a first set of physical connections, each physical connection created between a port on a point of delivery (POD) and a port on a patch panel;
   a first set of logical connections within each patch panel of the network;
   receiving a set of capacity intents, each capacity intent within the set of capacity intents corresponding to each pair of PODs within the network; and
determining with one or more computing devices a set of reconfigurations to logical links within each patch panel of the network to generate a second network topology;
wherein the second network topology comprises a logical topology for each patch panel pod in the network, and in which the summation over all pod-level multigraphs for the second network topology is equal to the received set of capacity intents.

¶12. The computer readable medium of ¶11 further comprising instructions when executed generating instructions related to the set of reconfigurations.

¶13. The computer readable medium of ¶¶11-12 further comprising instructions when executed generating instructions related to the set of reconfigurations.

¶14. The computer readable medium of ¶¶11-13 further comprising instructions when executed, sending the set of instructions related to the set of reconfigurations to a user device.

¶15. The computer readable medium of ¶¶11-14 wherein the instructions related to the set of reconfigurations are grouped by failure domain.

¶16. A network, the network comprising:
a set of points of delivery (POD), each POD having m ports;
a set of patch panels, each patch panel having n ports;
a set of physical connections, each physical connection formed between a port of a POD and a port of a patch panel;
a current set of logical links within each patch panel, wherein the logical link is derived using an algorithm,
wherein the algorithm takes as inputs (i) the set of physical connections, (ii) a set of capacity intent for the network, and (iii) a prior set of logical links and outputs the current set of logical links within each panel such that the overlap between the prior set of logical links and a current set of logical links is approximately the possible maximum overlap.

¶17. The network of ¶16, wherein the approximation is within 10% of a global solution.

¶18. The network of ¶¶16-17, wherein the current set of logical links meets the inputted set of capacity intents for the network.

¶19. The network of ¶¶16-18 wherein each POD is connected with each patch pane, and each patch panel is connected with each POD.

¶20. The network of ¶¶16-19 wherein the output can be implemented in stages, each stage corresponding to a failure domain of the network.

The invention claimed is:

1. A method of reconfiguring a network, the method comprising:
   determining a first network topology, the first network topology comprising:
      a first set of physical connections, each physical connection created between a port on a point of delivery (POD) and a port on a patch panel;
      a first set of logical connections within each patch panel of the network;
   receiving a set of capacity intents, each capacity intent within the set of capacity intents corresponding to each pair of PODs within the network; and
   determining with one or more computing devices a set of reconfigurations to logical links within each patch panel of the network to generate a second network topology;
   wherein the second network topology comprises a logical topology for each patch panel in the network, each logical topology corresponding to a pod-level multigraph, and in which a summation over all POD-level multigraphs for the second network topology is equal to the received set of capacity intents.

2. The method of claim 1 wherein the first network topology is represented as a multigraph.

3. The method of claim 1 wherein the set of reconfigurations of logical links approximates a minimal or smallest number of reconfigurations within the set of reconfigurations to the logical links.

4. The method of claim 1 wherein the set of reconfigurations does not alter the existing physical connections of the network.

5. The method of claim 1 further comprising generating instructions related to the set of reconfigurations.

6. The method of claim 5 further comprising sending the set of instructions related to the set of reconfigurations to a user device.

7. The method of claim 6 further comprising the set of instructions related to the set of reconfigurations being stored as human-readable instructions.

8. The method of claim 6 further comprising receiving, at a user device, an indication that a reconfiguration from the set of reconfigurations of a logical link has successfully been reconfigured.

9. The method of claim 1 wherein the computing device recursively 2-partitions the second network topology as part of determining the set of reconfigurations of logical links.

10. The method of claim 1 wherein the second network topology satisfies a failure domain constraint for the network.

11. A non-transient computer readable medium containing program instructions, the instructions when executed perform the steps of:
   determining a first network topology, the first network topology comprising:
      a first set of physical connections, each physical connection created between a port on a point of delivery (POD) and a port on a patch panel;
      a first set of logical connections within each patch panel of the network;
   receiving a set of capacity intents, each capacity intent within the set of capacity intents corresponding to each pair of PODs within the network; and
   determining with one or more computing devices a set of reconfigurations to logical links within each patch panel of the network to generate a second network topology;
   wherein the second network topology comprises a logical topology for each patch panel in the network, each logical topology corresponding to a POD-level multigraph, and in which a summation over all POD-level multigraphs for the second network topology is equal to the received set of capacity intents.

12. The computer readable medium of claim 11 further comprising program instructions when executed generating instructions related to the set of reconfigurations.

13. The computer readable medium of claim 11 further comprising program instructions when executed generating instructions related to the set of reconfigurations.

14. The computer readable medium of claim 13 further comprising program instructions when executed sending the set of instructions related to the set of reconfigurations to a user device.

15. The computer readable medium of claim 13 wherein the instructions related to the set of reconfigurations are grouped by failure domain.

16. A network, the network comprising:
   a set of points of delivery (POD), each POD having m ports;
   a set of patch panels, each patch panel having n ports;
   a set of physical connections, each physical connection formed between a port of a POD and a port of a patch panel;
   a current set of logical links within each patch panel, wherein the current set of logical links are derived using an algorithm,
   wherein the algorithm takes as inputs (i) the set of physical connections, (ii) a set of capacity intent for the network, and (iii) a prior set of logical links and outputs the current set of logical links within each panel and estimates the maximum overlap between the prior set of logical links and a current set of logical links.

17. The network of claim 16, wherein an estimation from the estimating is within 10% of a global solution.

18. The network of claim 16, wherein the current set of logical links meets the inputted set of capacity intents for the network.

19. The network of claim 18 wherein each POD is connected with each patch panel, and each patch panel is connected with each POD.

20. The network of claim 16 wherein the output can be implemented in stages, each stage corresponding to a failure domain of the network.

* * * * *